United States Patent
Son et al.

(10) Patent No.: US 9,640,680 B1
(45) Date of Patent: May 2, 2017

(54) WIDE-BAND TRANSPARENT ELECTRICAL CONTACTS AND INTERCONNECTS FOR FPAS AND A METHOD OF MAKING THE SAME

(71) Applicant: HRL Laboratories, LLC, Malibu, CA (US)

(72) Inventors: Kyung-Ah Son, Moorpark, CA (US);
Hasan Sharifi, Agoura Hills, CA (US);
Jeong-Sun Moon, Moorpark, CA (US);
Wah S. Wong, Montebello, CA (US);
Hwa Chang Seo, Torrance, CA (US)

(73) Assignee: HRL Laboratories, LLC, Malibu, CA (US)

( * ) Notice: Subject to any disclaimer, the term of this patent is extended or adjusted under 35 U.S.C. 154(b) by 81 days.

(21) Appl. No.: 14/183,237

(22) Filed: Feb. 18, 2014

Related U.S. Application Data

(60) Provisional application No. 61/766,217, filed on Feb. 19, 2013.

(51) Int. Cl.
*H01L 31/0224* (2006.01)
*H01L 27/146* (2006.01)

(52) U.S. Cl.
CPC .. *H01L 31/022466* (2013.01); *H01L 27/1469* (2013.01); *H01L 27/14634* (2013.01); *H01L 27/14636* (2013.01); *H01L 31/022491* (2013.01)

(58) Field of Classification Search
CPC ....... H01L 27/14649; H01L 31/022466; Y02E 10/50
See application file for complete search history.

(56) References Cited

U.S. PATENT DOCUMENTS

| | | | |
|---|---|---|---|
| 8,022,390 B1 * | 9/2011 | Kim et al. | 257/21 |
| 2004/0046123 A1 | 3/2004 | Dausch | |
| 2011/0281070 A1 * | 11/2011 | Mittal et al. | 428/142 |
| 2012/0007118 A1 * | 1/2012 | Choi | H01L 33/382 257/98 |
| 2012/0107598 A1 | 5/2012 | Zou et al. | |
| 2012/0264254 A1 * | 10/2012 | Wan | 438/84 |
| 2013/0048339 A1 | 2/2013 | Tour et al. | |
| 2013/0102109 A1 | 4/2013 | Stewart et al. | |
| 2013/0221219 A1 * | 8/2013 | Torabi | 250/338.1 |
| 2014/0034976 A1 * | 2/2014 | Chu | H01L 33/08 257/93 |
| 2014/0084266 A1 | 3/2014 | Yang et al. | |
| 2015/0084002 A1 | 3/2015 | Song et al. | |
| 2015/0280011 A1 | 10/2015 | Cho et al. | |

OTHER PUBLICATIONS

T. Chen, T. Ma, R.C. Barker, "Infrared Transparent and Electrically Conductive Thin Film of IN2O3", Appl. Phys. Lett. 43, No. 10, pp. 901-903, Nov. 1983.

(Continued)

*Primary Examiner* — Thomas L Dickey
(74) *Attorney, Agent, or Firm* — Ladas & Parry

(57) ABSTRACT

An optical device includes an optically transparent and electrically conducting conductor including graphene, a network of metal nanowires, or graphene integrated with a network of metal nanowires. The optical device includes a II VI compound semiconductor, a III V compound semiconductor, or InAsSb.

26 Claims, 13 Drawing Sheets

(56) References Cited

OTHER PUBLICATIONS

D.S. Ghosh, L. Martinez, S. Giurgola, P. Vergani, and V. Prneri, "Widely Transparent Electrodes Based on Ulrathin Metals", Optics Letters, vol. 34, No. 3, pp. 325-327, Feb. 1, 2009.

Z. Wu, Z. Chen, X. Du, et al., "Transparent Conductive Carbon Nanotube Films", Science, vol. 305, pp. 1273-1276, Aug. 27, 2004.

Changwook Jeong, et al., "Prospects for Nanowire-Doped Polycrystalline Graphene Films for Ultatransparent, Highly Conductive Electrodes", Nano Letters, Oct. 10, 2011, vol. 11, pp. 5020-5025.

Iskandar N. Kholmanov et al., "Improved Electrical Conductivity of Graphene Films Integrated With Metal Nanowires", Nano Letters, Oct. 20, 2012, vol. 12, pp. 5679-5683.

Mi-Sun Lee et al., "High-Performance, Transparent, and Stretchable Electrodes Using Graphene-Metal Nanowire Hybrid Structures", Nano Letters, May 2013, vol. 13, pp. 2814-2821.

Tong Lai Chen et al., "Hybrid Transparent Conductive Film on Flexible Glass Formed by Hot-Pressing Graphene on a Silver Nanowire Mesh", ACS Applied Materials & Interfaces vol. 5, Oct. 2013, pp. 11756-11761.

J.S. Moon et al., "Ultra-low Resistance OHMIC Contacts in Graphene Field Effect Transistors", Applied Physics Letters, vol. 100, May 2012, pp. 203512-1-203512-3.

Liangbing Hu, et al., "Infrared Transparent Carbon Nanotube Thin Films", Applied Physics Letters, vol. 94, Feb. 2009, pp. 081103-1-081103-3.

Aqariden et al., "Development of Molecular Beam Epitaxially Grown Hg1-xCdxTe for High-Density Vertically-Integrated Photodiode-Based Focal Plane Arrays", Journal of Electronic Materials, vol. 36, No. 8, 2007, pp. 900-904.

From U.S. Appl. No. 14/530,365 (unpublished; Non-publication requested) Restriction Requirement mailed on Jan. 26, 2015.

From U.S. Appl. No. 14/530,365 (unpublished; Non-publication requested) Non-Final Office Action mailed on Apr. 17, 2015.

From U.S. Appl. No. 14/530,365 (unpublished; Non-publication requested) Final Office Action mailed on Jul. 27, 2015.

U.S. Appl. No. 14/530,365, filed Oct. 31, 2014, Son, Kyung-Ah.

From U.S. Appl. No. 14/530,365 (Unpublished; Non-Publication Requested), Non-Final Rejection mailed on Jan. 6, 2016.

\* cited by examiner

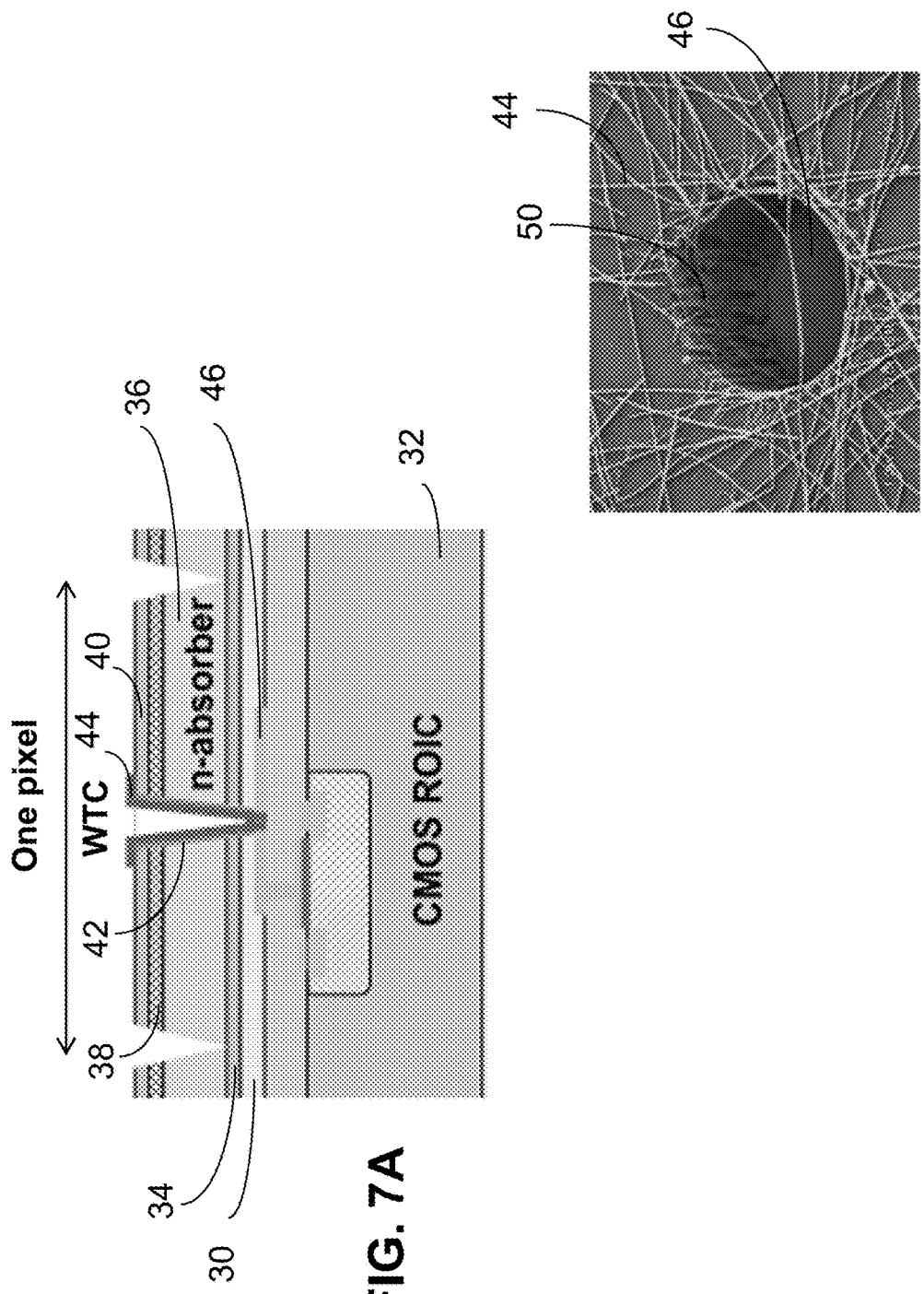

WIDE-BAND TRANSPARENT ELECTRICAL CONTACTS AND INTERCONNECTS FOR FPAS AND A METHOD OF MAKING THE SAME

CROSS REFERENCE TO RELATED APPLICATIONS

This application is related to and claims priority from U.S. Provisional Application Ser. No. 61/766,217, filed Feb. 19, 2013, which is incorporated herein as though set forth in full. This application is also related to U.S. patent application Ser. No. 14/158,962, filed Jan. 20, 2014, which is incorporated herein as though set forth in full.

STATEMENT REGARDING FEDERAL FUNDING

This invention was made under U.S. Government contract NRO000 13 C 0046. The U.S. Government has certain rights in this invention.

TECHNICAL FIELD

This disclosure relates to focal plane arrays (FPAs), and in particular to electrical contacts and interconnects for focal plane arrays.

BACKGROUND

Applications such as wide area surveillance and threat detection are driving the need for infrared (IR) camera technology with high density focal plane arrays (FPAs) with large formats greater than, for example, 5 k×5 k pixels and with less than, for example, 10 μm×10 μm pixel size. Conventional nontransparent metal contacts in 3D IR detectors partially cover the active area of the IR detector, resulting in a decrease of external quantum efficiency (QE). The impact on external QE is increasingly worse as the pixel size is reduced. Replacing conventional nontransparent metal contacts with wideband transparent conductors (WTC) is critical for achieving small pixels without compromising detector performance. Wideband transparent conductors in focal plane arrays for visible to long wavelength IR (wavelengths ranging from ~380 nm to 18 μm) detectors can improve detector performance.

In the prior art, an indium bump bonding process has been used for hybridizing and interconnecting sensor FPAs with readout integrated circuits (ROICs). However, even the best present hybridization process has insufficient yield to meet the requirements of FPA cameras with large formats. Further, more than 4000 kg of force would be needed to hybridize large format arrays with ROICs using a bump bonding process, which is well beyond the capability of hybridization tools.

To address the indium bump process limitations, an heterogeneous integration process may be used, which can eliminates the need for indium bump hybridization. Such a heterogeneous integration process has been described in U.S. patent application Ser. No. 14/158,962, filed Jan. 20, 2014, which is incorporated herein as though set forth in full. With this heterogeneous integration process, large format focal plane arrays can be fabricated by directly bonding an IR sensor wafer to a silicon ROIC wafer followed by removal of the sensor wafer substrate. Then pixel level interconnects to the ROIC may be fabricated by etching deep vias, passivating the via sidewalls, and coating the sidewalls of the vias with an electrical conductor. However, electrical contacts and interconnects made of conventional nontransparent metal for through substrate via holes result in a degraded detector fill factor and decreased external quantum efficiency (QE), which limits future scaling of high density (HD), large format FPAs.

In the prior art, Indium tin oxide (ITO) has been well established as a transparent conductor in the visible wavelength range. However, ITO has less than 30% transmittance ($T_\lambda$) in the infrared 6 12 μm range with a film sheet resistance ($R_s$) of 36 Ω/sq., as described by D. S. Ghosh, L. Martinez, S. Giurgola, P. Vergani, and V. Prneri, "Widely transparent electrodes based on ultrathin metals", *Optics Letters*, 34, 325 (2009).

T. Chen, T. Ma, R. C. Baker, "Infrared transparent and electrically conductive thin film of $In_2O_3$", *Appl. Phys. Lett.* 43, 901 (1983) measured a $T_\lambda$ of about 16% 26% in the 6 12 μm wavelength IR range with a $R_s$ ~36 Ω/sq. using indium oxide ($In_2O$).

D. S. Ghosh, L. Martinez, S. Giurgola, P. Vergani, and V. Prneri, "Widely transparent electrodes based on ultrathin metals", *Optics Letters*, 34, 325 (2009) describe that ultra thin Ni metal films may have a $T_\lambda$ of about 80% in the 4 25 μm wavelength range with an $R_s$ ~110 Ω/sq.; however that is rather high for an ohmic contact.

Z. Wu, Z. Chen, X. Du, et al., "Transparent, conductive carbon nanotube films", *Science*, 305, 1273 (2004) describe that carbon nanotube (CNT) films may have a $T_\lambda$ of about 15% 80% in the 1 12 μm wavelength range with an $R_s$ ~30 Ω/sq.; however, the wide variation in IR transparency, which is due to the electronic band structure of CNTs, is a major drawback for an IR transparent conductor application. In general, carbon based materials, including CNTs, have not been demonstrated to form ohmic contacts.

What is needed are electrical contacts and interconnects for focal plane arrays that have an improved transmittance ($T_\lambda$) in the visible to infrared range with a low $R_s$. Also needed are electrical contacts and interconnects that do not result in a degraded detector fill factor and decreased external quantum efficiency (QE). The embodiments of the present disclosure answer these and other needs.

SUMMARY

In a first embodiment disclosed herein, an optical device comprises an optically transparent and electrically conducting conductor comprising graphene, a network of metal nanowires, or graphene integrated with a network of metal nanowires, wherein the optical device comprises a II VI compound semiconductor, a III V compound semiconductor, or InAsSb.

In another embodiment disclosed herein, a focal plane array comprises a detector array having a plurality of II VI, III V, or InAsSb detectors, each detector having an ohmic contact and a via hole, a read out integrated circuit bonded to the detector array, and a wideband transparent conductor coupled to the ohmic contact and through the via hole between each respective detector and a respective contact on the read out integrated circuit for conducting electrical signals between the detector and the read out integrated circuit, wherein the wideband transparent conductor comprises graphene, a network of metal nanowires, or graphene integrated with a network of metal nanowires.

In yet another embodiment disclosed herein, a method of making a focal plane array comprises providing a detector array having a plurality of II VI, III V, or InAsSb detectors, each detector having an ohmic contact and a via hole, bonding a read out integrated circuit to the detector array, and forming a wideband transparent conductor coupled to the ohmic contact and through the via hole between each respective detector and a respective contact on the read out integrated circuit for conducting electrical signals between the detector and the read out integrated circuit, wherein the wideband transparent conductor comprises graphene, a network of metal nanowires, or graphene integrated with a network of metal nanowires.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 7A shows a cross sectional view of a 3D vertically integrated InAsSb IR detector fabricated using WTC based electrical contacts and interconnects, and FIG. 7B shows a SEM image of an WTC Ag NW (silver nanowire) network in a via for integration of an IR detector with an ROIC in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes IR transparent electrical contacts/interconnects for IR detectors and focal plane arrays (FPAs) and a method of making them, which will enable small pixels less than or equal to 5 µm×5 µm in size with a high fill factor to realize high quantum efficiency in a large format of greater than 5 k×5 k, for example.

Wide band transparent conductors (WTCs) for electrical contacts and interconnects are described based on nanostructured materials, which may be metal nanowires, such as silver nanowire (Ag NW), metal nanowires, such as Ag NW integrated with atomic layer deposition (ALD) of ultra thin (<10 nm) metal film, graphene, and graphene integrated with nanowires. The WTCs may also be referred to as infrared transparent conductors (ITCs), when used for infrared detectors.

Figure 1B:
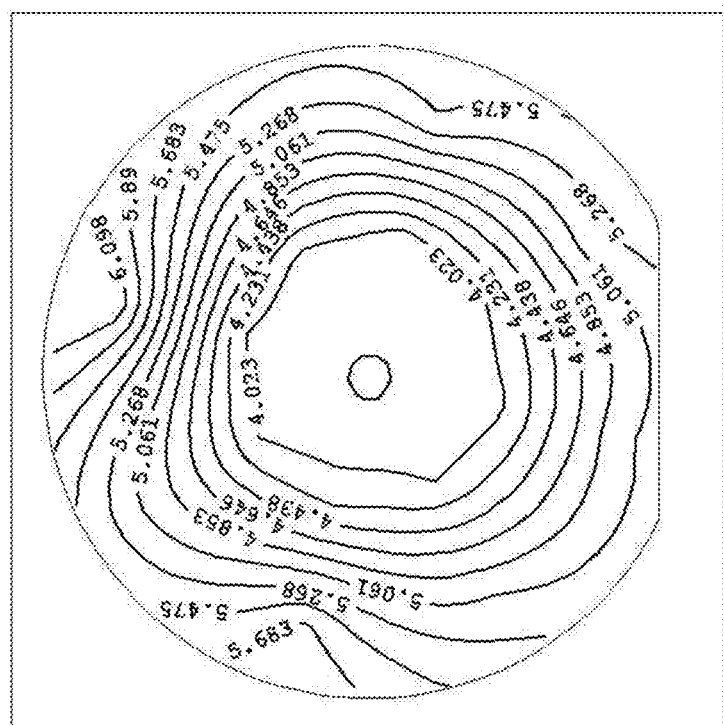
FIG. 1B shows a sheet resistance (Rs) map in accordance with the present disclosure.
Figure 1A:
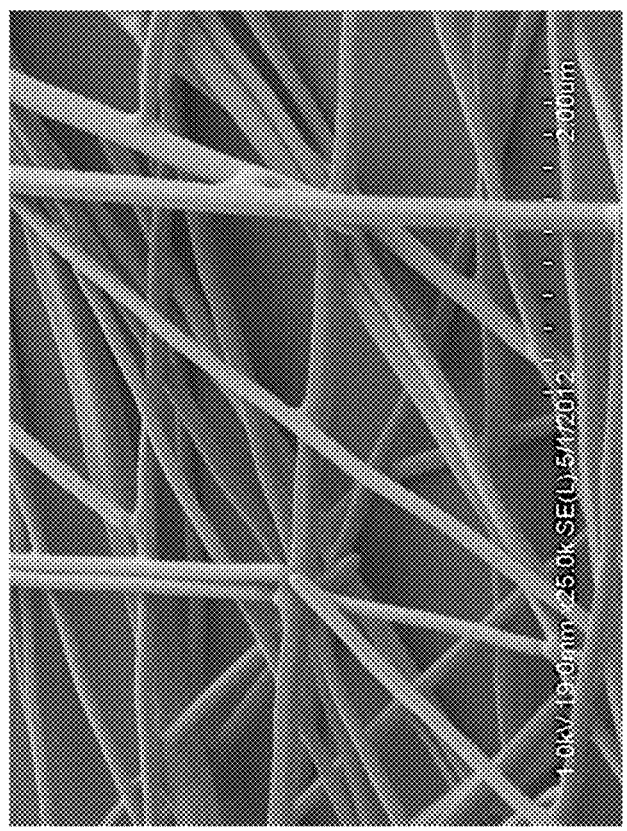
FIG. 1A shows a SEM image of a silver nanowire network spin coated on a Pyrex wafer.
Figure 2A:
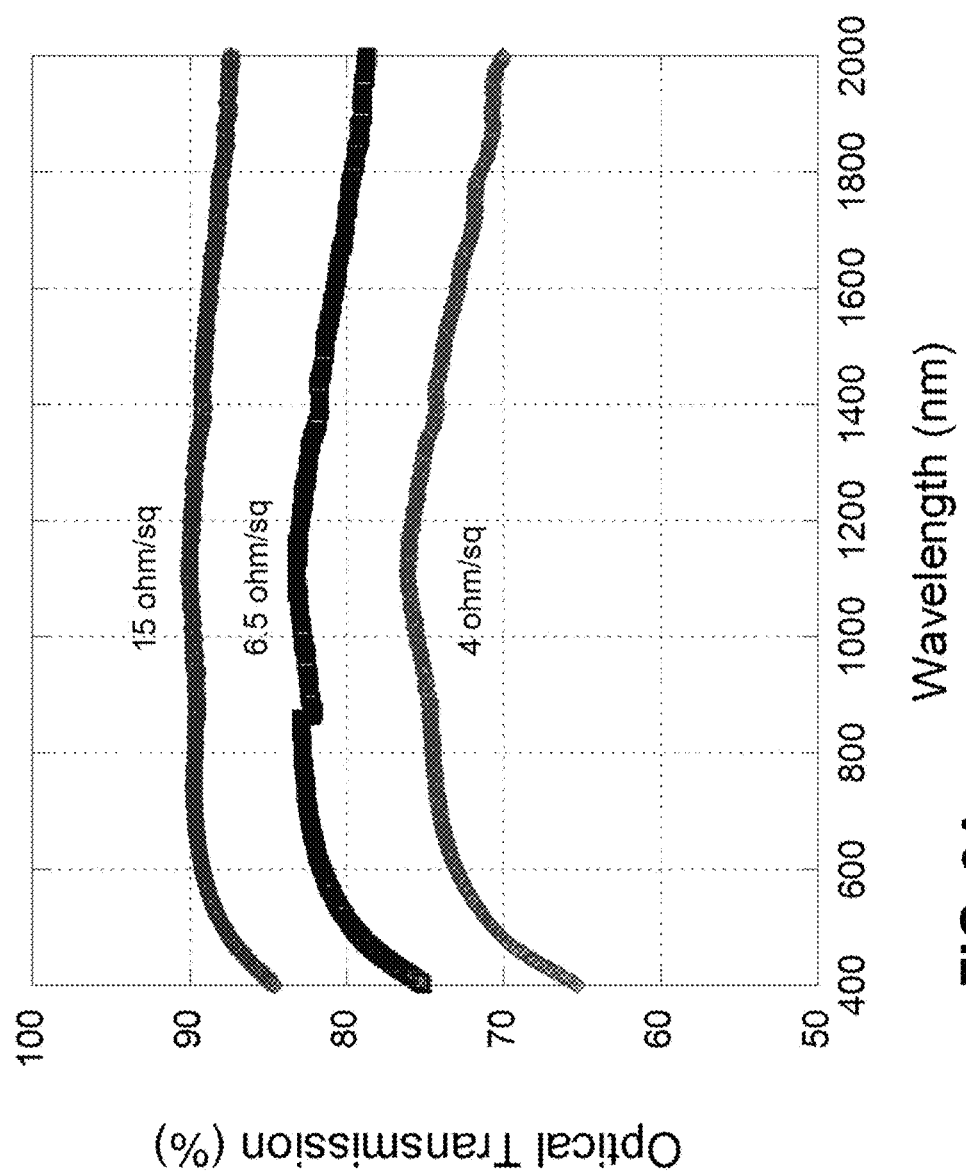
FIG. 2A shows a graph of measurements of the optical transmittance of silver nanowire network in the visible to short wavelength IR (SWIR) range using a Pyrex substrate.
Figure 2B:
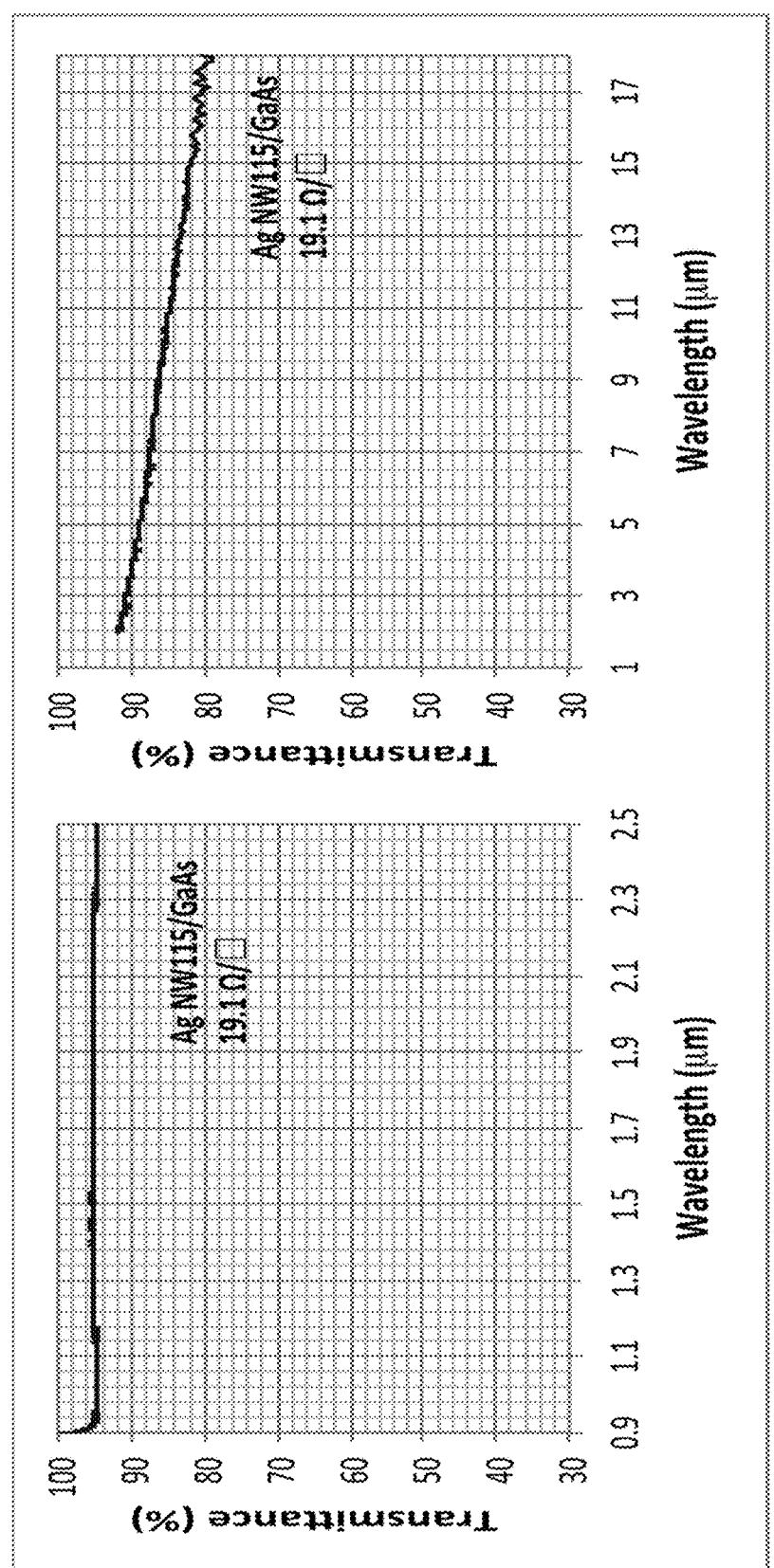
FIG. 2B shows the optical transmittance ($T_\lambda$) of an Ag NW115 network on a GaAs sample substrate measured in the near infrared to long wavelength IR range in accordance with the present disclosure.

FIG. 1A shows a SEM image and FIG. 1B shows a sheet resistance ($R_s$) map of Ag NW spin coated on a 3 inch pyrex substrate. FIG. 2A shows a graph of measurements of the optical transmittance of silver nanowire films (Ag NW) in the visible to short wavelength IR (SWIR) range using a pyrex substrate, and FIG. 2B shows a graph of transmittance measurements in a near IR (NIR) to long wavelength IR (LWIR) range using an Ag film NW deposited on a GaAs substrate. An $R_s$ of 4 15 Ω/sq., and a transmittance of 70 90% has been measured in the visible to short wavelength IR (SWIR) range for wavelengths of 400 to 2000 nm, as shown in FIG. 2A. The Ag NW films also provide good transmittance for longer wavelengths, in the NIR LWIR range for wavelengths of 0.9 17.5 µm, as shown in FIG. 2B. For example, an Ag NW film with an $R_s$ of 19.1 Ω/sq. has an optical transmittance of greater than 94% over the wavelength range of 0.9 µm to 2.5 µm. As the wavelength increases from 2 µm to 17 µm, the transmittance decreases gradually from about 94% to about 80%.

Figure 3A:
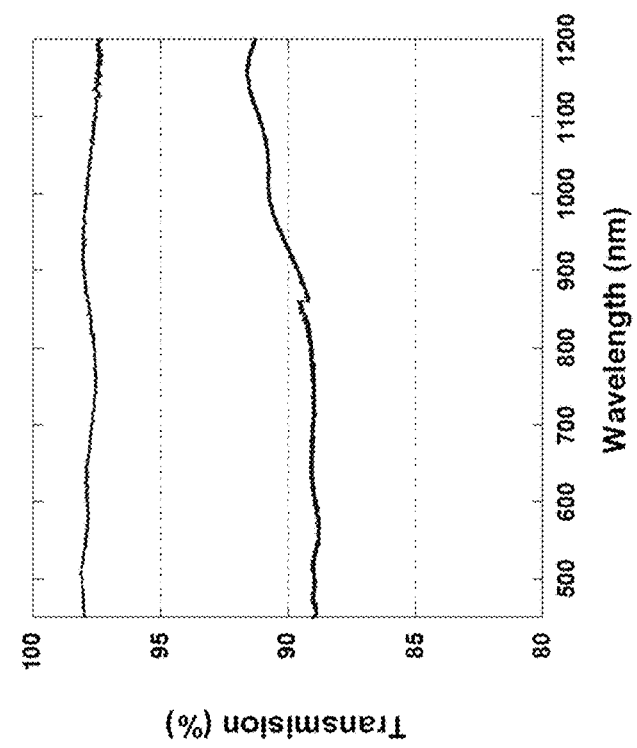
FIG. 3A shows an atomic force microscope (AFM) image and FIG. 3B shows an optical transmittance curve of epitaxial graphene grown on a SiC substrate measured in a visible to shortwavelength IR range, and shows $T_\lambda > 97\%$ is measured with a single layer epitaxial graphene with Rs~750 Ω/sq. in the entire visible and near infrared (NIR) region in accordance with the present disclosure.
Figure 3B:
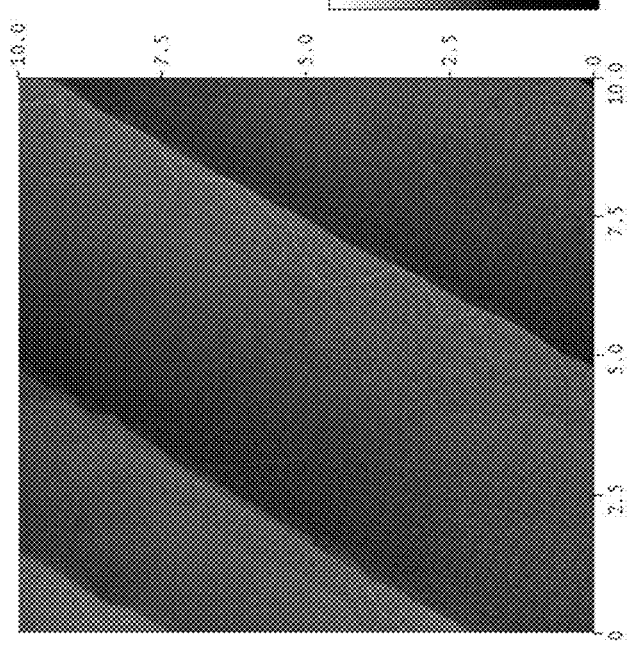

FIG. 3A shows an atomic force microscope (AFM) image and FIG. 3B shows a graph of the optical transmittance for epitaxial graphene grown on a SiC substrate measured in a visible to shortwave IR range for wavelengths of 500 to 1200 nm. FIG. 3B shows a $T_\lambda$ of greater than 97% for a single layer epitaxial graphene with Rs~750 Ω/sq. in the entire visible and near infrared (NIR) region.

Figure 4A:
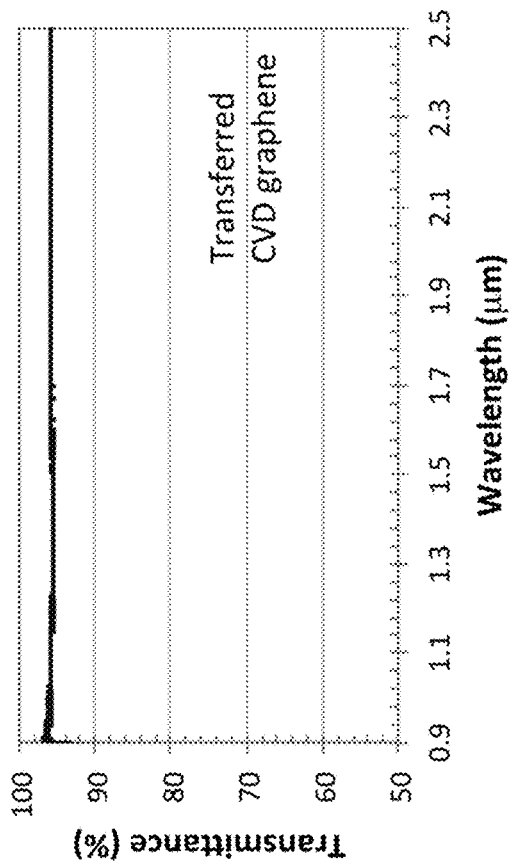
FIGS. 4A and 4B show graphs of the IR transmittance of graphene grown using chemical vapor deposition (CVD) and transferred onto a GaAs substrate showing a measured $T_\lambda > 95\%$ in the wavelength range of 0.9 16 µm for $R_s$~600 1000 Ω/Sq. in accordance with the present disclosure.
Figure 4B:
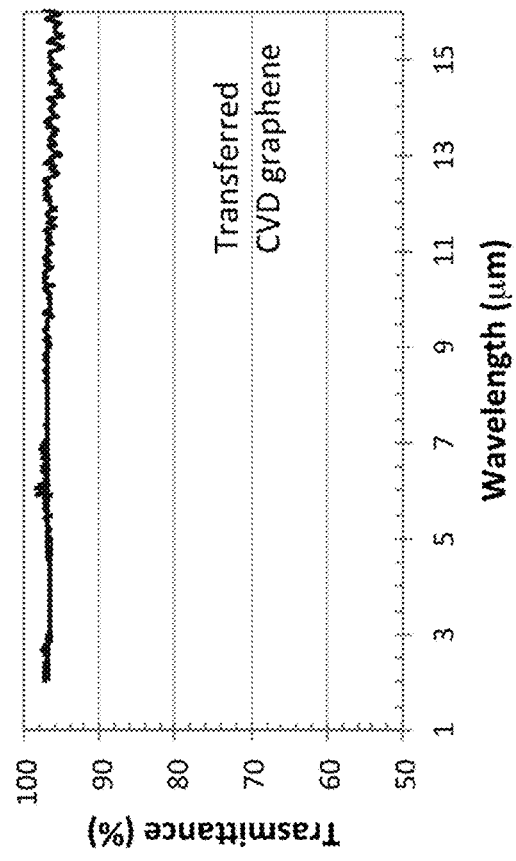

FIGS. 4A and 4B show graphs of the IR transmittance for graphene grown using CVD and transferred onto a GaAs substrate. The IR transmittance $T_\lambda$ is shown in FIGS. 4A and 4B to be greater than 95% in the wavelength range of 0.9 µm 16 µm. for graphene with a $R_s$~600 1000 Ω/sq.

The near constant spectral transmittance of >95%, as shown in FIGS. 3B, 4A and 4B, for graphene measured in the entire wavelength range of visible to long wavelength IR is the highest optical transmittance for wide band transparent conductor (WTC) materials that has been observed.

The sheet resistance $R_s$ measured for epitaxial graphene ranges from 200 750 Ω/sq. depending on the number of graphene layers and may be reduced to form electrical contacts and interconnects by chemical doping or by integrating electrically conductive nanowires into the graphene.

Graphene for wide band transparent conductor (WTC) contacts and interconnects may be grown on a substrate, which may be metal film or metal foil, using chemical vapor deposition (CVD), and may be transferred to various target surfaces, including semiconductors, polymers, and glass.

Figure 5B:
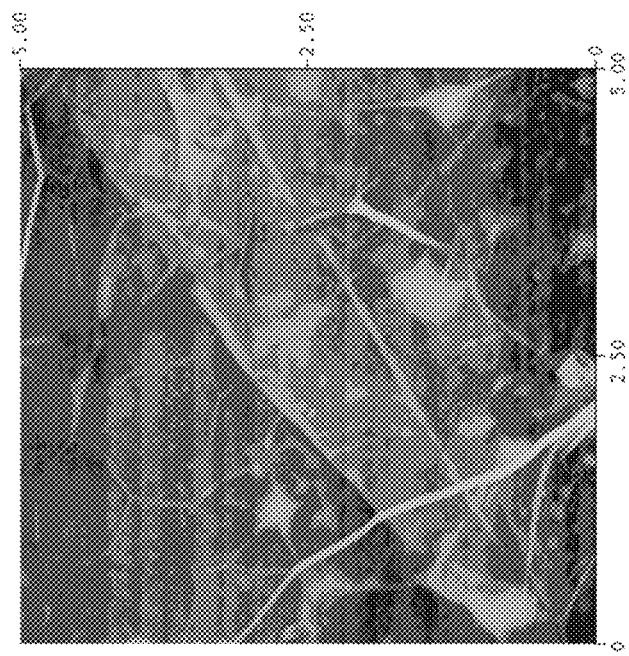
FIGS. 5A and 5B show AFM images and FIG. 5C shows a sheet resistance map of graphene grown using chemical vapor deposition (CVD) and transferred onto a high sheet resistance Si wafer in accordance with the present disclosure.
Figure 5A:
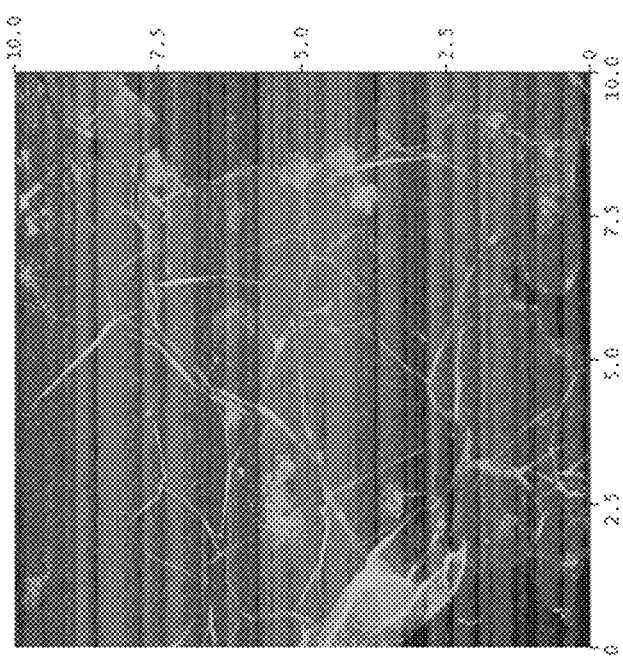
Figure 5C:
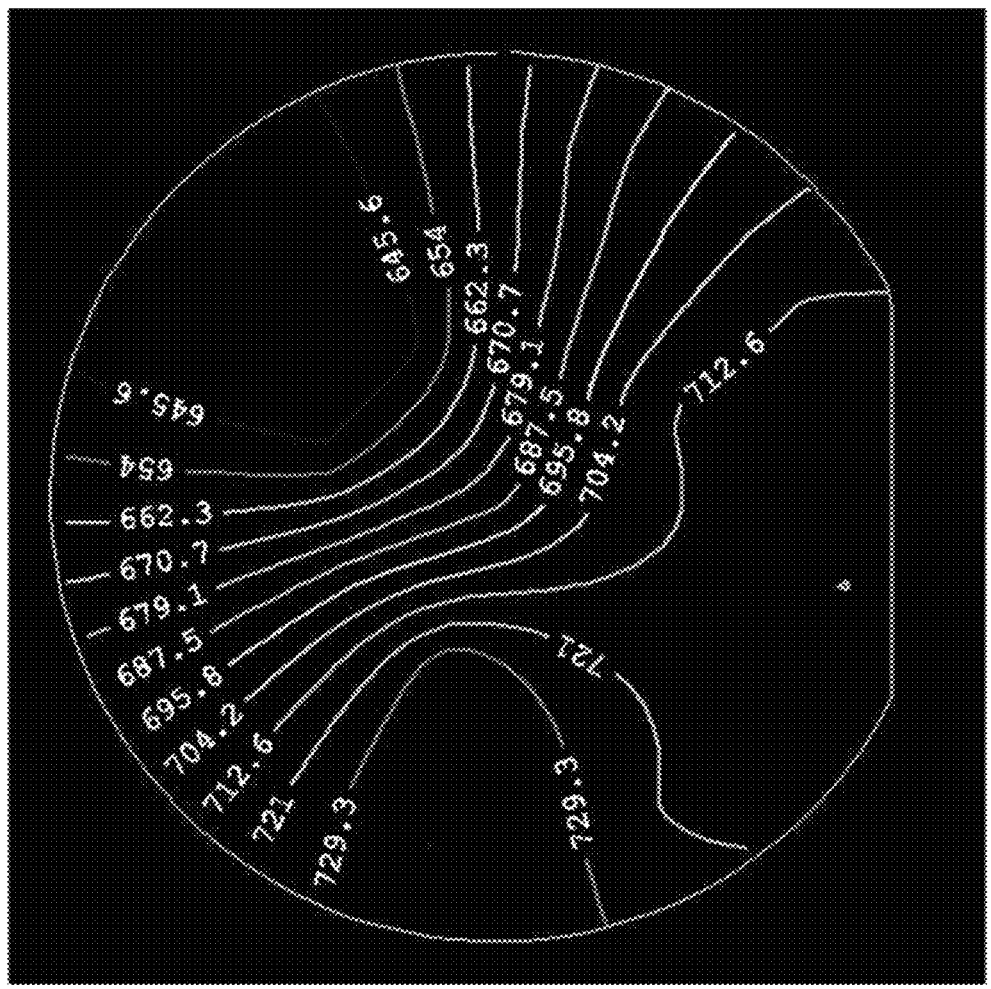

FIGS. 5A and 5B show atomic force microscope (AFM) images and FIG. 5C shows a sheet resistance map of graphene grown using chemical vapor deposition (CVD) and transferred onto a high sheet resistance Si wafer. Dispersed flakes of graphene or graphene oxide in solvents may also be applied to a target surface for wide band transparent conductor (WTC) contacts and interconnects. Graphene oxide can be reduced to graphene to be electrically conducting, by using chemical or optical means.

Wide band transparent conductor (WTC) materials may be integrated as electrical contacts and or interconnects in a two dimensional (2D) or a three dimensional (3D) configuration for IR detectors and focal plane arrays (FPAs).

Figure 6:
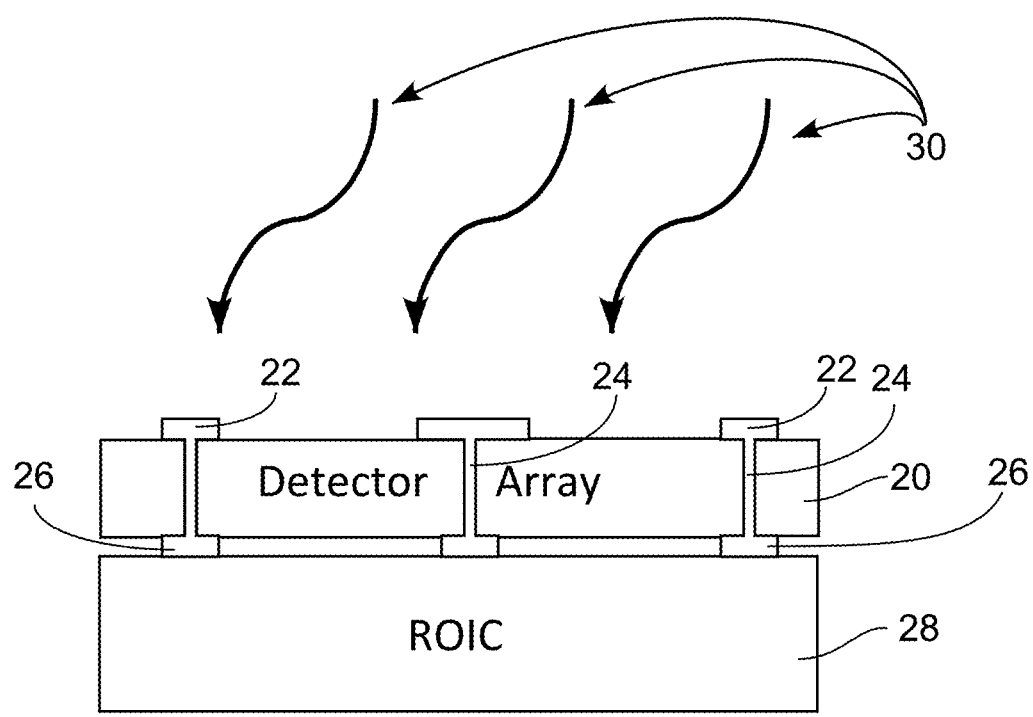
FIG. 6 shows a schematic of a high density detector array fabricated with wide band transparent conductor (WTC) based electrical contacts and interconnects for three dimensional (3D) heterogeneous integration with a read out integrated circuit (ROIC) in accordance with the present disclosure.

FIG. 6 shows a front side illuminated detector array 20 for detecting illumination 30. The detector array 20, which may be a focal plane array, has wide band transparent conductor (WTC) based electrical contacts 22 on its surface, and WTC interconnects 24 connected to the electrical contacts 22 and to contacts 26 on a read out integrated circuit (ROIC) 28. The contacts 26 on the ROIC may be metal contacts. Each WTC contact 22 conducts electrical signals from a pixel detector, which may be a visible or IR detector, to a contact 26 on the ROIC 28 via a WTC electrical interconnect 24. The three dimensional (3D) heterogeneous integration of the focal plane array 20 with the read out integrated circuit (ROIC) 28 provides a compact volume. The WTC contacts and interconnects replace conventional nontransparent metal contacts/interconnects used in the prior art. As a result, the external quantum efficiency (QE) and signal to noise ratio (SNR) of the IR detectors in the FPA 20 are enhanced.

FIG. 7A shows a cross sectional view of one pixel of a focal plane array with 3D vertical integration of a detector array with a read out integrated circuit (ROIC) using WTC based electrical contacts and interconnects. The detector array has an array of pixels, each of which may be a visible or IR detector. For example, an IR detector may be an InAsSb IR detector. The 3D integration process is further described in U.S. patent application Ser. No. 14/158,962, filed Jan. 20, 2014, which is incorporated herein as though set forth in full. A read out integrated circuit (ROIC) 32 is bonded with adhesive 30 to the detector. The detector has an n+ common contact 34. Each pixel is on a mesa and has an n absorber layer 36, an electron barrier layer 38, and an n+ contact 40. The interconnect from the n+ contact 40 to an ROIC contact 46 is through a wideband transparent conductor (WTC) 44, which may be an infrared transparent conductor (ITC). A via hole, which may be a through compound semiconductor via (TCSV) hole, is formed by etching or other processes through the detector layers. Then the sidewalls of the via hole are coated with passivation layer 42, which may be a dielectric. Then the WTC 44 is formed to connect to the n+ contact 40 and also formed on the sidewalls of the passivated via hole to connect to ROIC contact 46.

FIG. 7B shows a SEM image of a network of WTC or ITC silver nanowires (Ag NWs) 44 integrated with a via and shows the Ag NWs on the sidewalls 50 of the via hole for interconnect to the ROIC contact 46.

The WTC contacts and interconnects may be integrated in a 3D structure for a FPA and a ROIC, which has the advantage of eliminating the need for indium bump bonding, which is currently used to integrate IR detector arrays to read out integrated circuits (ROIC), as described above. The WTC contacts and interconnects disclosed herein enable wafer level integration of small IR pixels, for example, less than 5 μm by 5 μm in size to a ROIC. Large format FPAs may be realized with, for example, greater than 5 k×5 k formats and an external QE enhancement as high as ΔQE~20% compared to conventional non transparent metal contacts and interconnects.

Figure 8A:
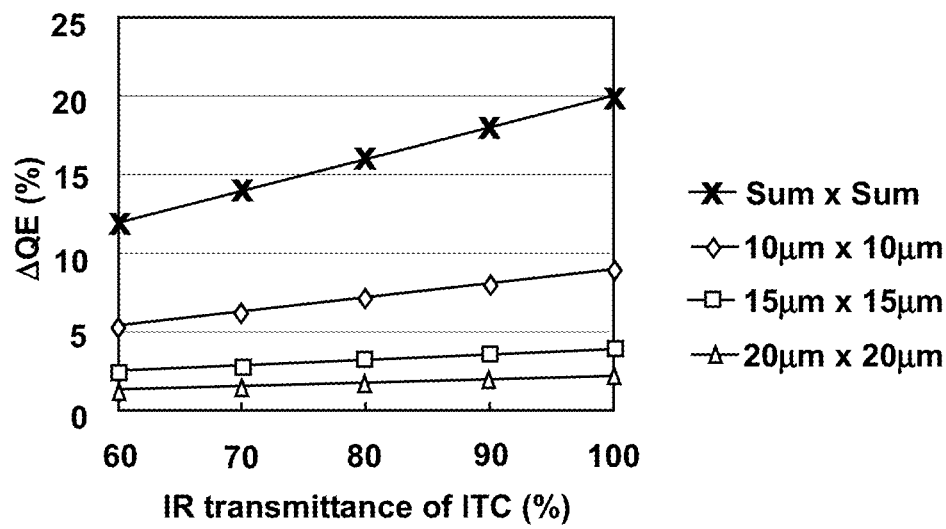
FIG. 8A shows a simulated external QE improvement (ΔQE) versus IR transmittance of an electrical contact estimated for various pixel sizes based on the increase of IR absorption area of an IR detector by replacing non transparent metal contacts/interconnects with wide band transparent conductor (WTC) contacts.
Figure 8B:
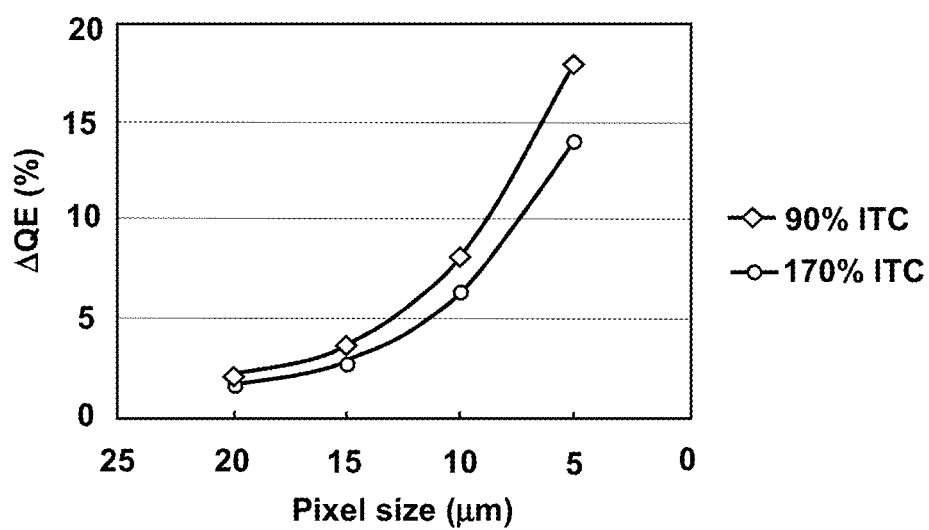
FIG. 8B shows ΔQE vs. pixel size estimated for a WTC with $T_\lambda=90\%$ and for a WTC with $T_\lambda=70\%$ in accordance with the present disclosure.

FIG. 8A shows a simulated delta QE improvement (ΔQE) versus IR transmittance of an electrical contact estimated for various pixel sizes from 5 μm×5 μm to 20 μm×20 μm based on an increase of IR absorption area of an IR detector by replacing non transparent metal contacts and interconnects with wide band transparent conductor (WTC) contacts and interconnects. FIG. 8B shows ΔQE vs. pixel size estimated for a WTC with $T_\lambda$=90% and for a WTC with $T_\lambda$=70%.

Figure 9:
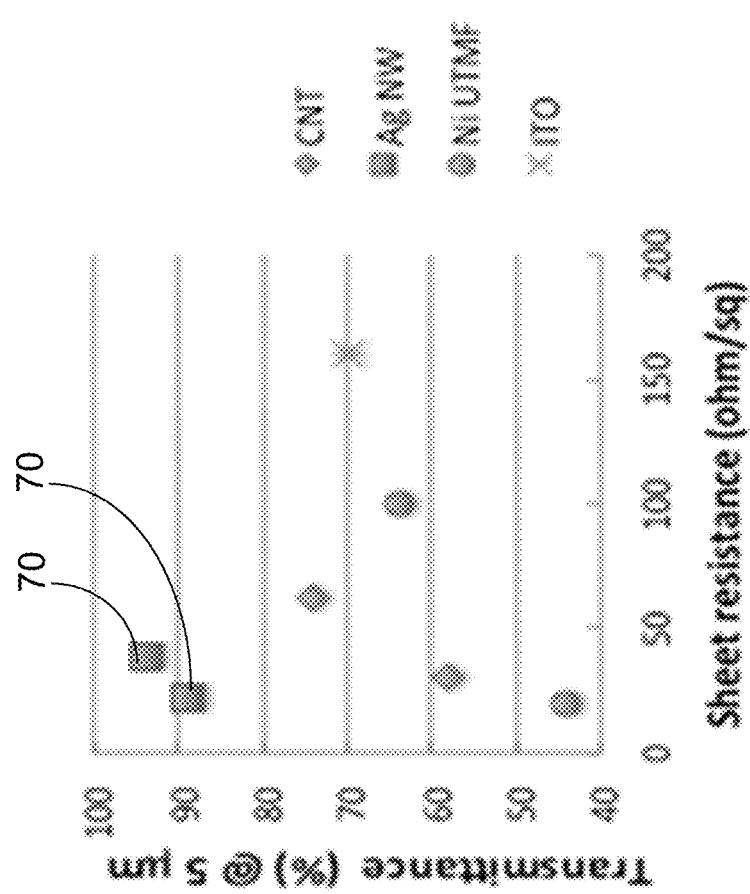
FIG. 9 compares the sheet resistance and transmittance of other prior art materials to the Ag NW films in accordance with the present disclosure.

Other materials have been considered for infrared transparent conductors including ultra thin metal films (UTMF), metal oxide semiconductors, and carbon nanotube (CNT). FIG. 9 compares the sheet resistance and transmittance of these materials to the Ag NW networks of the present disclosure. Ag NW networks outperform these other materials as shown by the Ag NW 70 results in the $T_\lambda$ versus $R_s$ plot of FIG. 9.

It is important for ohmic contacts to be made to detector diodes. Given the low detector bias voltage of 100 200 mV in InAsSb IR detectors, a low ohmic contact resistance to n+ InAsSb is highly desirable. It is known that indium makes a good n type contact to InAsSb, where InAsSb has a band gap of 0.17 0.35 eV and a work function (φ) of ~4.9 eV. The work function difference between In (φ ~4.12 eV) and Ag (φ ~4.26 eV) is only 0.14 eV. In the case of GaInAs, which has a band gap of 0.35 1.47 eV, Sn provides a good n type ohmic contact. The work function difference between Sn (φ ~4.42 eV) and Ag (φ ~4.26 eV) is just 0.16 eV. These small differences to the closely related III V materials systems indicate that Ag can form good n type ohmic contacts to the n+ InAsSb layer 40 as shown in FIG. 7A.

Figure 10:
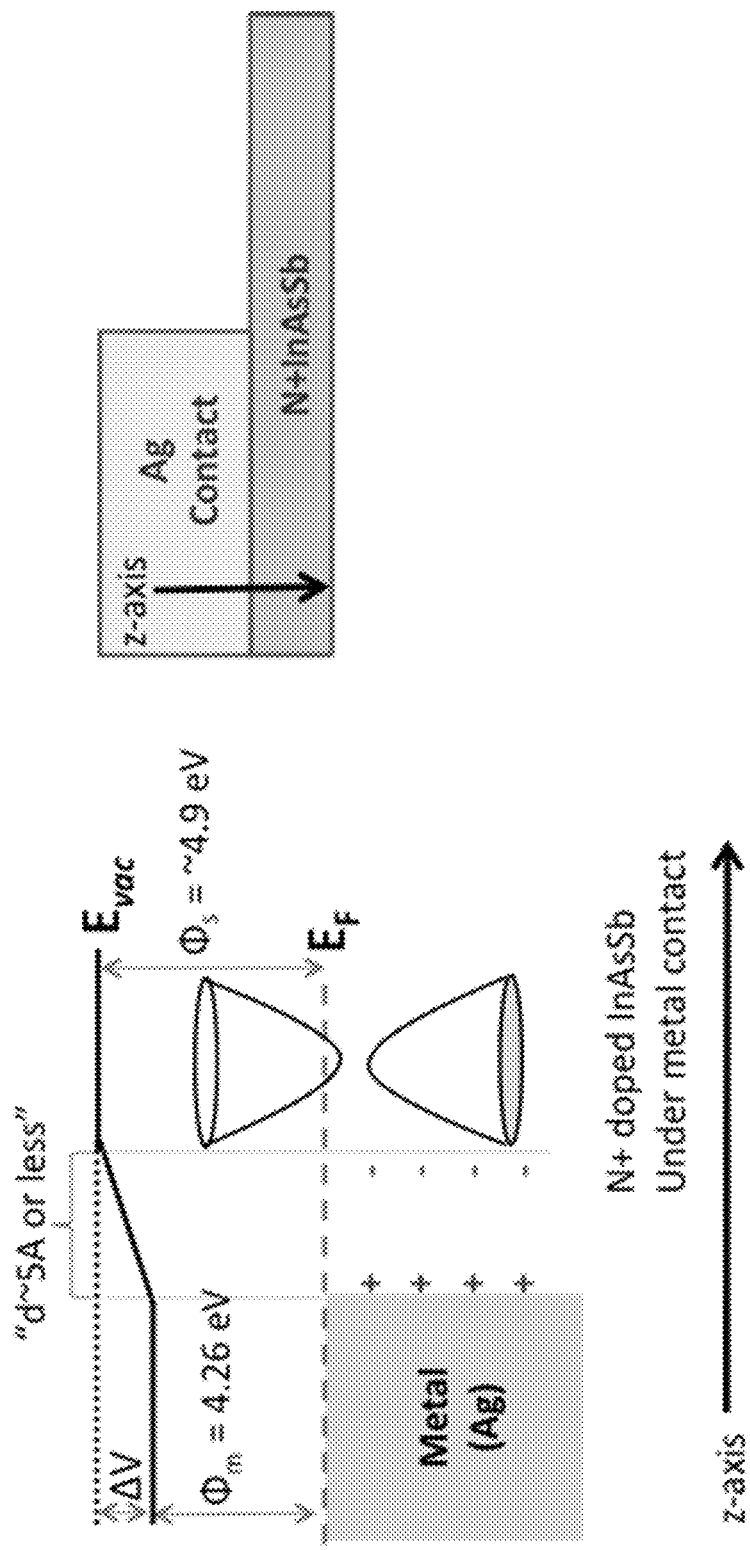
FIG. 10 shows a schematic of a band diagram of Ag on n+InAsSb in accordance with the present disclosure.

A simple band diagram of Ag on n+ InAsSb is depicted in FIG. 10, showing that Ag (φ ~4.26 eV) can provide n type contact to n+ InGaAs (φ ~4.9 eV) due to the relatively small work function difference.

Figure 11:
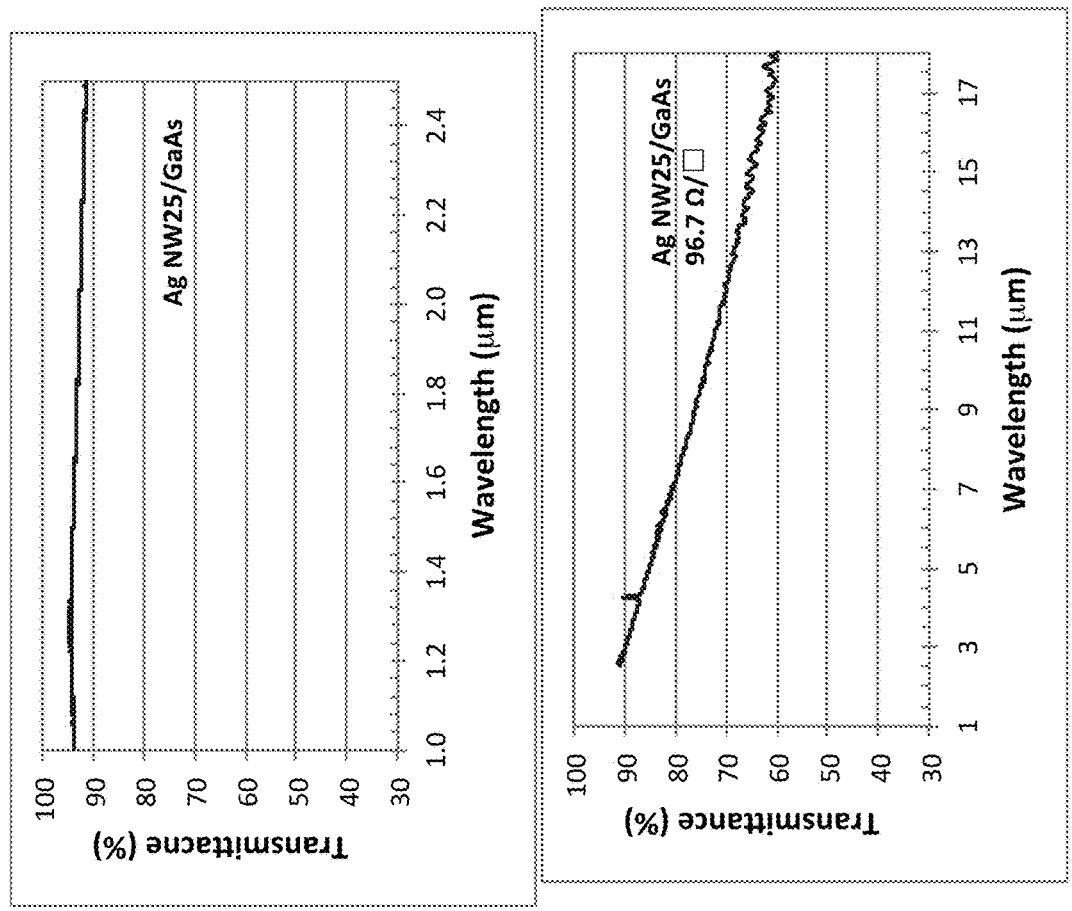
FIG. 11 shows the optical transmittance TX of an Ag NW25 network on a GaAs sample substrate measured in the NIR LWIR (near infrared long wavelength IR) range in accordance with the present disclosure.

Silver nanowire (Ag NW) networks prepared with different diameters (25 nm, 60 nm, 115 nm) and aspect ratios were studied. The best results in terms of optical transmittance and sheet resistance were obtained with Ag NWs with an average diameter of 115 nm and an average length of 25 μm. FIG. 2B shows the optical transmittance ($T_\lambda$) of an Ag NW network prepared with Ag NW115, which indicates Ag NWs with the average diameter of 115 nm and an average length of 35 μm, on a 3 inch GaAs wafer. Sheet resistance ($R_s$) of 19 Ω/sq. was measured with a uniformity of ~12% over the 3 inch GaAs wafer. In NIR to SWIR, a nearly uniform optical transmittance of 94% is measured with the Ag NW network in the wavelength range of 0.9 2.5 μm, as shown in FIG. 2B. The optical transmittance gradually decreases with increasing wavelength, as shown in FIG. 2B measuring $T_\lambda$~92% at 2 um and $T_\lambda$~89% at 5 um. An Ag NW network prepared with AgNW25, which indicates Ag NWs with the average diameter of 25 nm and the average length of 23 µm, was also investigated. Ag NW25 offers good $T_\lambda$ in NIR to SWIR, but the decrease of $T_\lambda$ is much faster for longer wavelengths, as shown in FIG. 11. Therefore, for a given $R_s$, a higher $T_\lambda$ in MWIR LWIR can be achieved with Ag NW115.

For example, FIG. 11 shows a graph of transmittance measurements in a near IR (NIR) to long wavelength IR (LWIR) range using an Ag film NW25 deposited on a GaAs substrate. An Ag NW film with an Rs of 96.7 Ω/sq. has an optical transmittance of greater or equal to 92% over the wavelength range of 0.9 µm to 2.5 µm. As the wavelength increases from 2 µm to 17 µm, the transmittance decreases gradually from ~92% to ~60%.

For Ag NW integration in 2 µm diameter via holes as well as other larger via holes, Ag NW25 (average diameter ~25 nm) is better suited for via hole integration. Ag NW115 (average diameter ~115 nm) is too stiff to be integrated to via holes. In terms of IR transmittance, an Ag NW network consisting of Ag NW115 is better than that of Ag NW25 in a longer wavelength range (MWIR LWIR), in particular.

A process for 3D integration of Ag NWs in vias, is to first deposit Ag NW25 in the via holes and then spin coat Ag NW115 for top contacts with high optical transmittance. For via holes, atomic layer deposition (ALD) of ultra thin (<10 nm) metal film may also be combined with the Ag NW25 deposition.

The present disclosure of optically transparent and electrically conductive conductors may be applied in many optical devices. The focal plane application described above is just one such application.

The present disclosure includes the following concepts.
Concept 1. An optical device comprising:
 an optically transparent and electrically conducting conductor comprising graphene, a network of metal nanowires, or graphene integrated with a network of metal nanowires;
 wherein the optical device comprises a II VI compound semiconductor, a III V compound semiconductor, or InAsSb.
Concept 2. The optical device of concept 1 wherein the optical device further comprises an infrared optical device.
Concept 3. The optical device of concept 1 wherein the metal nanowires have an average diameter ranging from 10 nm to 150 nm.
Concept 4. The optical device of concept 1 wherein:
 the conductor comprises metal nanowires integrated with ultra thin metal film having a thickness less than 10 nm.
Concept 5. The optical device of concept 1 wherein the conductor comprises:
 metal nanowires with an average diameter of less than 150 nm, an average length of greater than 5 µm, a sheet resistance ($R_s$) of less than or equal to 100 Ω/sq., an optical transmittance ($T_\lambda$) greater than 85% in a visible to a short wavelength IR wavelength range and greater than or equal to 75% in a short wavelength IR to long wavelength IR wavelength range.
Concept 6. The optical device of concept 1 wherein the conductor comprises:
 graphene with an optical transmittance ($T_\lambda$) of greater or equal to 85% from a visible to long wavelength infrared wavelength range.
Concept 7. A focal plane array comprising:
 a detector array having a plurality of II VI, III V, or InAsSb detectors, each detector having an ohmic contact and a via hole;
 a read out integrated circuit bonded to the detector array; and
 a wideband transparent conductor coupled to the ohmic contact and through the via hole between each respective detector and a respective contact on the read out integrated circuit for conducting electrical signals between the detector and the read out integrated circuit;
 wherein the wideband transparent conductor comprises graphene, a network of metal nanowires, or graphene integrated with a network of metal nanowires.
Concept 8. The focal plane array of concept 7 wherein the wideband transparent conductor is transparent to infrared wavelengths.
Concept 9. The focal plane array of concept 7 wherein the via hole is in a semiconductor layer and the via hole further comprises a dielectric on the via hole to passivate the via hole.
Concept 10. The focal plane array of concept 7 wherein the metal nanowires have an average diameter ranging from 10 nm to 150 nm.
Concept 11. The focal plane array of concept 7 wherein:
 an ohmic contact of the wideband transparent conductor to the detector comprises metal nanowires having a diameter of less than or equal to 150 nm; and
 a wideband transparent conductor on a sidewall of the via hole comprises metal nanowires having a diameter of less than or equal to 70 nm.
Concept 12. The focal plane array of concept 7 wherein:
 the wideband transparent conductor comprises metal nanowires integrated with ultra thin metal film having a thickness less than 10 nm.
Concept 13. The focal plane array of concept 7 wherein:
 each detector of the plurality of detectors is less than or equal to 10 µm×10 µm in area.
Concept 14. The focal plane array of concept 7 wherein the detectors operate in a wavelength range between visible wavelengths and long wavelength infrared wavelengths.
Concept 15. The focal plane array of concept 7 wherein the wideband transparent conductor comprises:
 metal nanowires with an average diameter of less than 150 nm, an average length of greater than 5 µm, a sheet resistance ($R_s$) of less than or equal to 100 Ω/sq., an optical transmittance ($T_\lambda$) greater than 85% in a visible to a short wavelength IR wavelength range and greater than or equal to 75% in a short wavelength IR to long wavelength IR wavelength range.
Concept 16. The focal plane array of concept 7 wherein the wideband transparent conductor comprises:
 graphene with an optical transmittance ($T_\lambda$) of greater than or equal to 85% from a visible to long wavelength infrared wavelength range.
Concept 17. A method of making a focal plane array comprising:
 providing a detector array having a plurality of II VI, III V, or InAsSb detectors, each detector having an ohmic contact and a via hole;
 bonding a read out integrated circuit to the detector array; and
 forming a wideband transparent conductor coupled to the ohmic contact and through the via hole between each respective detector and a respective contact on the read out integrated circuit for conducting electrical signals between the detector and the read out integrated circuit;
 wherein the wideband transparent conductor comprises graphene, a network of metal nanowires, or graphene integrated with a network of metal nanowires.
Concept 18. The method of concept 17 wherein the wideband transparent conductor is transparent to infrared wavelengths.

Concept 19. The method of concept 17 wherein the via hole is formed in a semiconductor layer and the via hole further comprises a dielectric on a sidewall of the via hole to passivate the via hole.

Concept 20. The method of concept 17 wherein the metal nanowires have an average diameter ranging from 10 nm to 150 nm.

Concept 21. The method of concept 17 wherein:
the ohmic contact of the wideband transparent conductor to the detector comprises metal nanowires having a diameter of less than or equal to 150 nm; and
a wideband transparent conductor on a sidewall of the via hole comprises metal nanowires having a diameter of less than or equal to 70 nm.

Concept 22. The method of concept 17 wherein:
the wideband transparent conductor comprises metal nanowires integrated with ultra thin metal film having a thickness less than 10 nm.

Concept 23. The method of concept 17 wherein:
each detector of the plurality of detectors is less than or equal to 10 µm×10 µm in area.

Concept 24. The method of concept 17 wherein the detectors operate in a wavelength range between visible wavelengths and long wavelength infrared wavelengths.

Concept 25. The method of concept 17 wherein the wideband transparent conductor comprises:
metal nanowires with an average diameter of less than 150 nm, an average length of greater than 5 µm, a sheet resistance ($R_s$) less than or equal to 100 Ω/sq., an optical transmittance ($T_\lambda$) greater than 85% in a visible to a short wavelength IR wavelength range and greater than or equal to 75% in the short wavelength IR to long wavelength IR wavelength range.

Concept 26. The method of concept 17 wherein the wideband transparent conductor comprises:
graphene with an optical transmittance ($T_\lambda$) of greater than or equal to 85% from a visible to long wavelength infrared wavelength range.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. An optical device comprising:
an optically transparent and electrically conducting conductor comprising graphene, a network of metal nanowires, or graphene integrated with a network of metal nanowires; wherein
the optical device comprises a II-VI compound semiconductor, a III-V compound semiconductor, or InAsSb; and
said optically transparent and electrically conducting conductor forming electrical contacts and interconnects of an integrated circuit in said optical device; said electrical contacts and interconnects comprising at least a via hole interconnection; the via hole interconnection comprising a via hole coated with a passivation layer, said optically transparent and electrically conducting conductor being formed on the passivation layer on the sidewalls of the passivated via hole.

2. The optical device of claim 1 wherein the optical device further comprises an infrared optical device.

3. The optical device of claim 1 wherein the metal nanowires have an average diameter ranging from 10 nm to 150 nm.

4. The optical device of claim 1 wherein the conductor comprises:
metal nanowires with an average diameter of less than 150 nm, an average length of greater than 5 µm, a sheet resistance (Rs) of less than or equal to 100 Ω/sq., an optical transmittance ($T_\lambda$) greater than 85% in a visible to a short wavelength IR wavelength range and greater than or equal to 75% in a short wavelength IR to long wavelength IR wavelength range.

5. The optical device of claim 1 wherein the conductor comprises:
graphene with an optical transmittance ($T_\lambda$) of greater or equal to 85% from a visible to long wavelength infrared wavelength range.

6. A focal plane array comprising:
a detector array having a plurality of II-VI, III-V, or InAsSb detectors, each detector having an ohmic contact and a via hole having sidewalls passivated with a passivation layer;
a read out integrated circuit bonded to the detector array; and
a wideband transparent conductor coupled to the ohmic contact and through the via hole between each respective detector and a respective contact on the read out integrated circuit for conducting electrical signals between the detector and the read out integrated circuit; said wideband transparent conductor being formed on the passivation layer of said passivated sidewalls;
wherein the wideband transparent conductor comprises graphene, a network of metal nanowires, or graphene integrated with a network of metal nanowires.

7. The focal plane array of claim 6 wherein the wideband transparent conductor is transparent to infrared wavelengths.

8. The focal plane array of claim 6 wherein the via hole is in a semiconductor layer and the via hole further comprises a dielectric on the via hole to passivate the via hole.

9. The focal plane array of claim 6 wherein the metal nanowires have an average diameter ranging from 10 nm to 150 nm.

10. The focal plane array of claim 6 wherein:
the wideband transparent conductor comprises metal nanowires integrated with ultra thin metal film having a thickness less than 10 nm.

11. The focal plane array of claim 6 wherein:
each detector of the plurality of detectors is less than or equal to 10 μm×10 μm in area.

12. The focal plane array of claim 6 wherein the detectors operate in a wavelength range between visible wavelengths and long wavelength infrared wavelengths.

13. The focal plane array of claim 6 wherein the wideband transparent conductor comprises:
metal nanowires with an average diameter of less than 150 nm, an average length of greater than 5 μm, a sheet resistance (Rs) of less than or equal to 100 Ω/sq., an optical transmittance ($T_\lambda$) greater than 85% in a visible to a short wavelength IR wavelength range and greater than or equal to 75% in a short wavelength IR to long wavelength IR wavelength range.

14. The focal plane array of claim 6 wherein the wideband transparent conductor comprises:
graphene with an optical transmittance ($T_\lambda$) of greater than or equal to 85% from a visible to long wavelength infrared wavelength range.

15. A method of making a focal plane array comprising:
providing a detector array having a plurality of II-VI, III-V, or InAsSb detectors, each detector having an ohmic contact and a via hole having passivated sidewalls;
bonding a read out integrated circuit to the detector array; and
forming a wideband transparent conductor coupled to the ohmic contact and through the via hole having passivated sidewalls between each respective detector and a respective contact on the read out integrated circuit for conducting electrical signals between the detector and the read out integrated circuit;
wherein the wideband transparent conductor comprises graphene, a network of metal nanowires, or graphene integrated with a network of metal nanowires.

16. The method of claim 15 wherein the wideband transparent conductor is transparent to infrared wavelengths.

17. The method of claim 15 wherein the via hole is formed in a semiconductor layer and the via hole further comprises a dielectric on a sidewall of the via hole to passivate the via hole.

18. The method of claim 15 wherein the metal nanowires have an average diameter ranging from 10 nm to 150 nm.

19. The method of claim 15 wherein:
the ohmic contact of the wideband transparent conductor to the detector comprises metal nanowires having a diameter of less than or equal to 150 nm; and
a wideband transparent conductor on a sidewall of the via hole comprises metal nanowires having a diameter of less than or equal to 70 nm.

20. The method of claim 15 wherein:
the wideband transparent conductor comprises metal nanowires integrated with ultra thin metal film having a thickness less than 10 nm.

21. The method of claim 15 wherein:
each detector of the plurality of detectors is less than or equal to 10 μm×10 μm in area.

22. The method of claim 15 wherein the detectors operate in a wavelength range between visible wavelengths and long wavelength infrared wavelengths.

23. The method of claim 15 wherein the wideband transparent conductor comprises:
metal nanowires with an average diameter of less than 150 nm, an average length of greater than 5 μm, a sheet resistance (Rs) less than or equal to 100 Ω/sq., an optical transmittance ($T_\lambda$) greater than 85% in a visible to a short wavelength IR wavelength range and greater than or equal to 75% in the short wavelength IR to long wavelength IR wavelength range.

24. The method of claim 15 wherein the wideband transparent conductor comprises:
graphene with an optical transmittance ($T_\lambda$) of greater than or equal to 85% from a visible to long wavelength infrared wavelength range.

25. An optical device comprising:
an optically transparent and electrically conducting conductor comprising graphene, a network of metal nanowires, or graphene integrated with a network of metal nanowires; wherein the optical device comprises a II-VI compound semiconductor, a III-V compound semiconductor, or InAsSb; wherein:
the conductor comprises metal nanowires integrated with ultra thin metal film having a thickness less than 10 nm.

26. A focal plane array comprising:
a detector array having a plurality of II-VI, III-V, or InAsSb detectors, each detector having an ohmic contact and a via hole;
a read out integrated circuit bonded to the detector array; and
a wideband transparent conductor coupled to the ohmic contact and through the via hole between each respective detector and a respective contact on the read out integrated circuit for conducting electrical signals between the detector and the read out integrated circuit;
wherein the wideband transparent conductor comprises graphene, a network of metal nanowires, or graphene integrated with a network of metal nanowires; and wherein:
an ohmic contact of the wideband transparent conductor to the detector comprises metal nanowires having a diameter of less than or equal to 150 nm; and
a wideband transparent conductor on a sidewall of the via hole comprises metal nanowires having a diameter of less than or equal to 70 nm.

* * * * *